US008638164B2

(12) United States Patent
Son et al.

(10) Patent No.: US 8,638,164 B2
(45) Date of Patent: Jan. 28, 2014

(54) AMPLIFIER INCLUDING DITHERING SWITCH AND DISPLAY DRIVING CIRCUIT USING THE AMPLIFIER

(75) Inventors: Young Suk Son, Daejeon-si (KR); Yong Sung Ahn, Ansan-si (KR); Hyun Ja Cho, Cheongju-si (KR); Hyung Seog Oh, Cheongju-si (KR); Dae Keun Han, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 415 days.

(21) Appl. No.: 13/062,652

(22) PCT Filed: Sep. 4, 2009

(86) PCT No.: PCT/KR2009/005028
§ 371 (c)(1),
(2), (4) Date: Mar. 7, 2011

(87) PCT Pub. No.: WO2010/027222
PCT Pub. Date: Mar. 11, 2010

(65) Prior Publication Data
US 2011/0169808 A1 Jul. 14, 2011

(30) Foreign Application Priority Data
Sep. 5, 2008 (KR) ........................ 10-2008-0087506

(51) Int. Cl.
*H03F 1/02* (2006.01)

(52) U.S. Cl.
USPC .................................. 330/9; 330/51; 330/257

(58) Field of Classification Search
USPC ........................................ 330/9, 252–261, 51
See application file for complete search history.

(56) References Cited

U.S. PATENT DOCUMENTS 6,373,459 B1 4/2002 Jeong
7,920,025 B2 * 4/2011 Nishimura et al. ........... 330/255

(Continued)

FOREIGN PATENT DOCUMENTS

CN 1773600 5/2006
CN 101174397 5/2008

(Continued)

OTHER PUBLICATIONS

International Search Report, Appln No. PCT/KR2009/005028, dated Apr. 20, 2010.

(Continued)

*Primary Examiner* — Hieu Nguyen
(74) *Attorney, Agent, or Firm* — Kile Park Reed & Houtteman PLLC

(57) ABSTRACT

An amplifier and a display driving circuit. The amplifier includes an input stage, a bias stage and an output stage. The input stage determines voltage levels of two nodes in correspondence to two input voltages received in response to a first bias voltage, and includes four path selecting switches, two input transistors and one bias transistor. The bias stage generates two class AB output voltages which correspond to the voltage levels of the two nodes, and includes current mirrors, ten path selecting switches, class AB bias circuits and two bias transistors. The output stage generates an output voltage VOUT that corresponds to the two class AB output voltages, and includes two coupling capacitors and two push-pull transistors. The plurality of path selecting switches operate by one signal of a first path selecting signal and a second path selecting signal that are exclusively enabled with respect to each other.

7 Claims, 13 Drawing Sheets

(56) References Cited

U.S. PATENT DOCUMENTS

| | | | |
|---|---|---|---|
| 2003/0103029 A1 | 6/2003 | Kokubun et al. | |
| 2008/0136806 A1 | 6/2008 | Lee et al. | |
| 2008/0204386 A1 | 8/2008 | Park | |

FOREIGN PATENT DOCUMENTS

| | | | |
|---|---|---|---|
| JP | 11-249624 | | 9/1999 |
| JP | 2002-062852 | | 2/2002 |
| JP | 2003-168936 | A | 6/2003 |
| JP | 2007-156235 | | 6/2007 |
| KR | 10-2000-0000788 | A | 1/2000 |
| KR | 10-2007-0009902 | A | 1/2007 |
| KR | 10-2008-0053600 | A | 6/2008 |

OTHER PUBLICATIONS

Written Opinion of the International Searching Authority, Appln No. PCT/KR2009/005028, dated Apr. 20, 2010.

* cited by examiner

AMPLIFIER INCLUDING DITHERING SWITCH AND DISPLAY DRIVING CIRCUIT USING THE AMPLIFIER

BACKGROUND OF THE INVENTION

1. Field of the Invention

The present invention relates to a display driving circuit, and more particularly, to a display driving circuit which uses an amplifier, appropriate for a display driving circuit, as a buffer.

2. Description of the Related Art

A display driving circuit functions to output valid data having image information to be reproduced, to a display panel.

FIG. 1 illustrates an output section of a display driving circuit.

Referring to FIG. 1, an output section of a display driving circuit 100 includes a positive gamma reference voltage generating circuit 110, a negative gamma reference voltage generating circuit 120, a digital circuit 130, a path transistor logic block 140, a path selecting switch circuit 150, a buffer block 160, an output selecting switch circuit 170, and an electric charge sharing switch circuit 180.

The path transistor logic block 140 selects and outputs gamma reference voltages corresponding to N-bit digital data outputted from the digital circuit 130, among $2^N$ (N is an integer) number of gamma reference voltages outputted from each of the positive gamma reference voltage generating circuit 110 and the negative gamma reference voltage generating circuit 120. The plurality of selected gamma reference voltages are outputted to one path of a first path as a direct path and a second path as a cross path by the path selecting switch circuit 150. The first path as a direct path means a path in which switches to be turned on by a first path selecting signal P1 are arranged, and the second path as a cross path means a path in which switches to be turned on by a second path selecting signal P1B are arranged. After being buffered in the buffer block 160, the gamma reference voltages outputted from the path selecting switch circuit 150 are transmitted to a display panel (not shown) via output terminals CH(1) through CH(M) (M is an integer) for a time during which an output selecting signal P3 is activated in the output selecting switch circuit 170. The electric charge sharing switch circuit 180 short-circuits the output terminals CH(1) through CH(M) for a predetermined time during which an electric charge sharing signal P2 is activated, so that all the output terminals CH(1) through CH(M) can share their electric charges.

Since the display driving circuit is generally known in the art, component elements, connection relationships among them, and their operational characteristics will not be described herein.

FIG. 2 is an internal circuit diagram of a plurality of amplifiers $A_{RR}$ used as buffers in the buffer block 160 shown in FIG. 1.

Referring to FIG. 2, an amplifier 200 includes an input stage 210, a bias stage 220, and an output stage 230.

The input stage 210 receives a positive input signal INP and a negative input signal INN by two P-type MOS transistors and two N-type MOS transistors in order to increase a common mode input voltage range. That is to say, the positive input signal INP is received by a P-type input MOS transistor P2 and an N-type input MOS transistor N2, and the negative input signal INN is received by a P-type input MOS transistor P1 and an N-type input MOS transistor N1. The common terminal of the two P-type input MOS transistors P1 and P2 is connected to a P-type current source P3, and the other remaining terminals thereof are connected to the bias stage 220. The common terminal of the two N-type input MOS transistors N1 and N2 is connected to an N-type current source N3, and the other remaining terminals thereof are connected to the bias stage 220.

The bias stage generates two class AB output signals $V_1$ and $V_2$ which correspond to the difference between the positive input signal INP and the negative input signal INN. The output stage 230 generates an output signal VOUT in response to the two class AB output signals $V_1$ and $V_2$.

In general, a method for manufacturing a semiconductor include a process for implanting impurities into a substrate using a mask formed with a preselected pattern, a process for diffusing the implanted impurities, a process for depositing a substance, and a process for etching the deposited substance to have a predefined pattern. In this regard, actually realized circuit elements cannot but have some differences from designed values due to non-correspondence of a mask pattern to a designed value caused in the course of fabricating the mask, non-correspondence and non-uniformity of an amount of impurities implanted into the substrate, and an etching tolerance.

The amplifier 200 shown in FIG. 2 is realized using twenty MOS transistors. These MOS transistors are designed to operate in a saturation region. The operational characteristics of MOS transistors are determined by the threshold voltages, the lengths of gate areas, the widths of the gate areas, and the material and the thickness of gate insulators. The threshold voltages, the lengths of gate areas, and the widths of the gate areas actually become slightly different from designed values due to the above-described reasons. Changes in the operational characteristics of the MOS transistors are usually represented as an offset voltage in an amplifier.

FIG. 3 shows offset spread in the conventional amplifier.

Referring to FIG. 3, an offset voltage becomes low or high with respect to an expected value due to the non-correspondence between a designed value and an actually realized transistor.

In order to reduce the influence of the offset, a method has been proposed in the art in which MOS transistors constituting an amplifier circuit are arranged to have a symmetric structure, and symmetric MOS transistors are alternately used using dithering switches.

FIG. 4 is a circuit diagram illustrating an amplifier added with dithering switches.

Referring to FIG. 4, an amplifier 400 added with dithering switches minimizes the offset by way of operation of the dithering switches which alternately switch symmetric MOS transistors and current mirrors. The dithering switches are switched in response to two signals A and B which are alternately enabled. Since the amplifier 400 added with the dithering switches are known in the art through papers, etc., description of the connection relationship and operation of the amplifier 400 will be omitted herein.

In the case of the amplifier 400 shown in FIG. 4, although the offset is minimized, because the amplifier 400 has twenty MOS transistors and ten dithering switches, a disadvantage is caused in that the area occupied by the amplifier 400 in a layout markedly increases. In particular, while the area occupied by the switches is not so great, the area occupied by the twenty MOS transistors in the layout is considerably great.

SUMMARY OF THE INVENTION

Accordingly, the present invention has been made in an effort to solve the problems occurring in the related art, and an object of the present invention is to provide an amplifier which has a minimum number of MOS transistors and a minimum number of dithering switches.

Another object of the present invention is to provide a display driving circuit which uses as a buffer an amplifier having a minimum number of MOS transistors and a minimum number of dithering switches.

In order to achieve the first object, according to one aspect of the present invention, there is provided an amplifier having an input stage, a bias stage and an output stage. The input stage determines voltage levels of two nodes in correspondence to two input voltages received in response to a first bias voltage, and includes four path selecting switches, two input transistors and one bias transistor. The bias stage generates two class AB output voltages which correspond to the voltage levels of the two nodes, and includes current mirrors, ten path selecting switches, class AB bias circuits and two bias transistors. The output stage generates an output voltage VOUT that corresponds to the two class AB output voltages, and includes two coupling capacitors and two push-pull transistors. The plurality of path selecting switches operate by one signal of a first path selecting signal and a second path selecting signal that are exclusively enabled with respect to each other.

In order to achieve the second object, according to another aspect of the present invention, there is provided a display driving circuit having a negative gamma reference voltage generating circuit, a positive gamma reference voltage generating circuit, a digital circuit, a path transistor logic circuit, a buffer circuit, a path selecting switch circuit, and an electric charge sharing switch circuit. The negative gamma reference voltage generating circuit generates $2^N$ (N is an integer) number of gamma reference voltages having voltage levels relatively lower than an optional reference voltage. The positive gamma reference voltage generating circuit generates $2^N$ number of gamma reference voltages having voltage levels relatively higher than the optional reference voltage. The digital circuit outputs N-bit digital signals. The path transistor logic circuit selects and outputs gamma reference voltages corresponding to the N number of digital signals outputted from the digital circuit, among the $2^N$ number of gamma reference voltages generated from each of the positive gamma reference voltage generating circuit and the negative gamma reference voltage generating circuit. The buffer circuit buffers the gamma reference voltages outputted from the path transistor logic circuit. The path selecting switch circuit selects paths of the gamma reference voltages outputted from the buffer circuit. The electric charge sharing switch circuit shares electric charges between output terminals for outputting the gamma reference voltages to a display panel.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
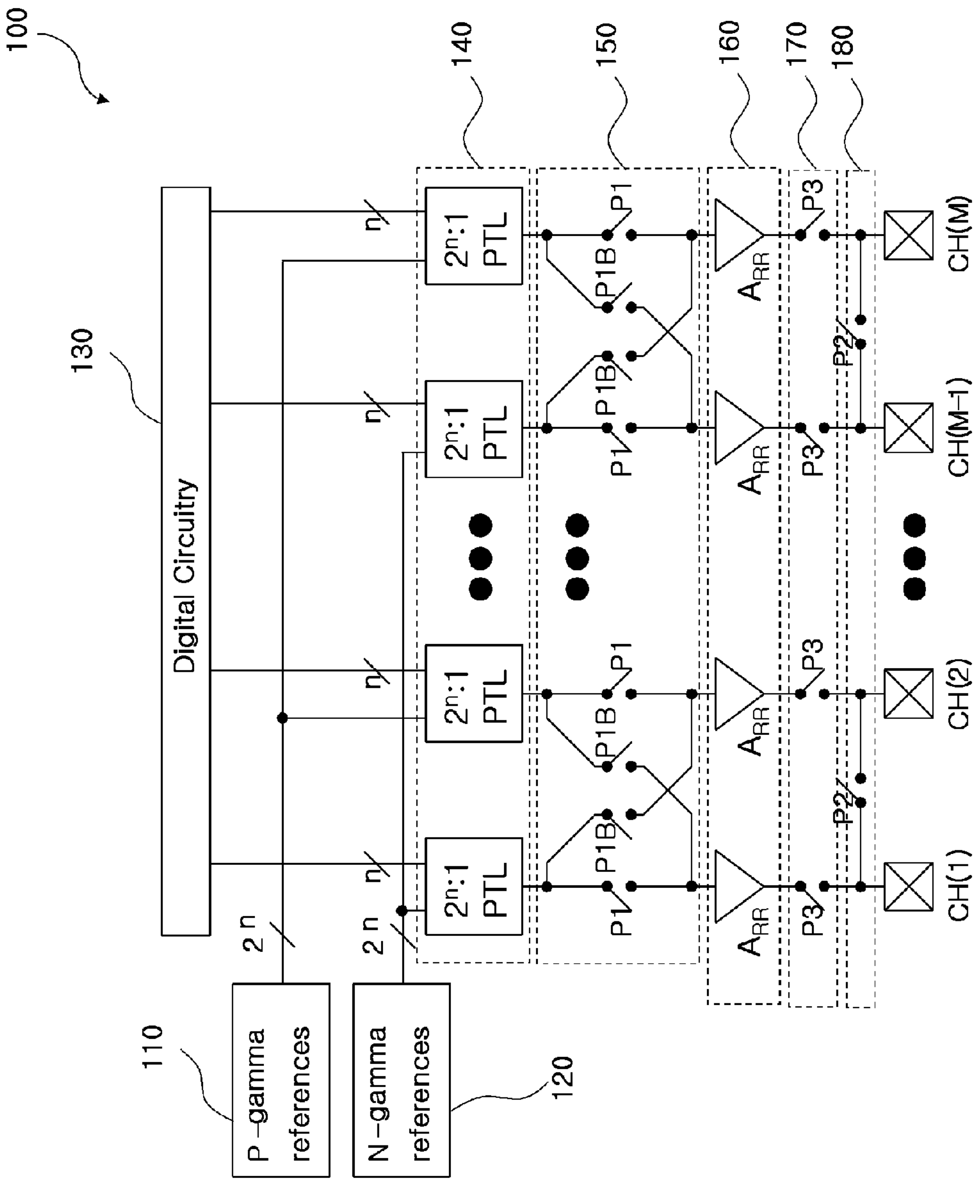
FIG. 1 illustrates an output section of a display driving circuit.
Figure 2:
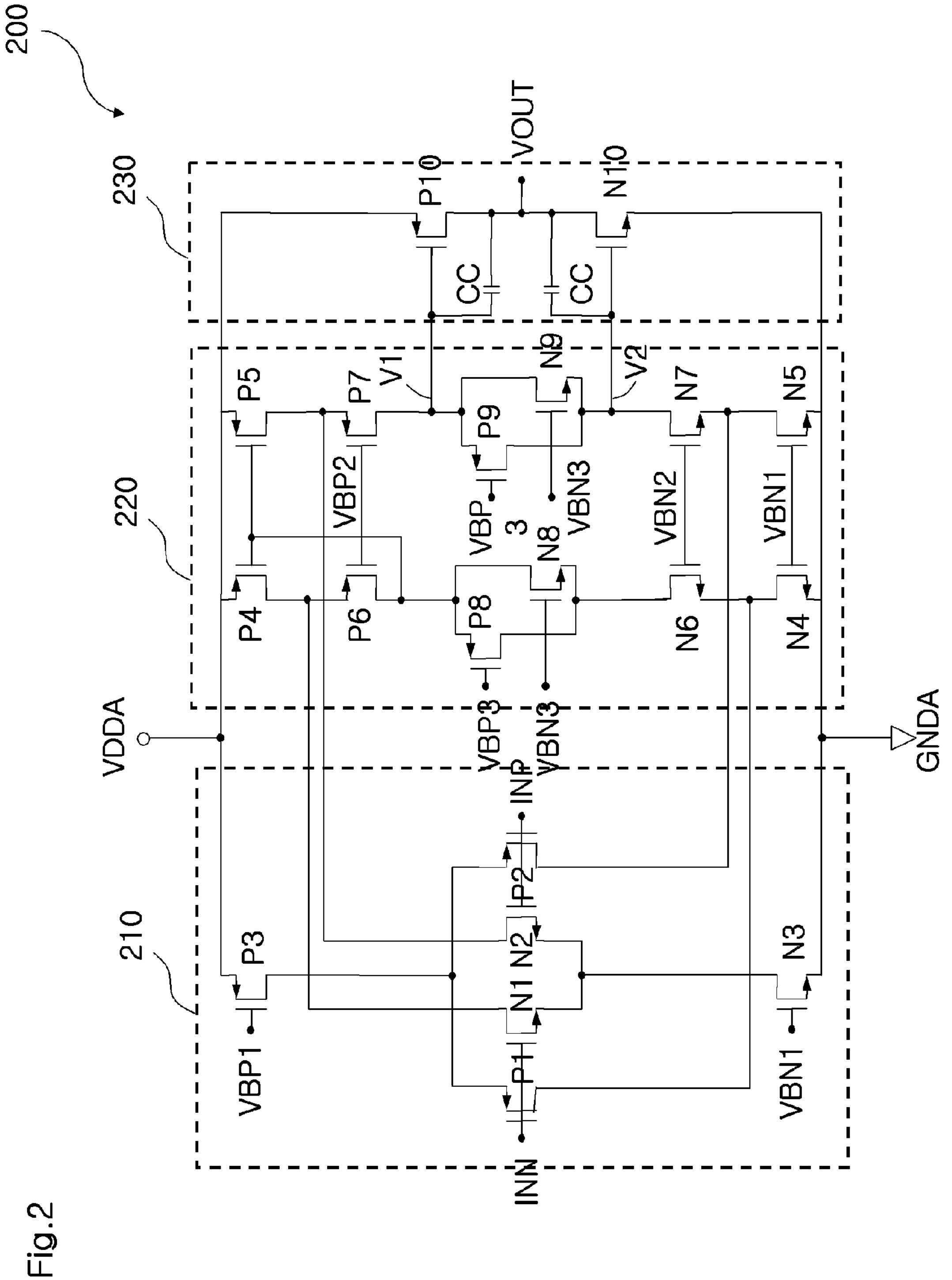
FIG. 2 is an internal circuit diagram of a plurality of amplifiers used as buffers in a buffer block shown in FIG. 1.
Figure 3:
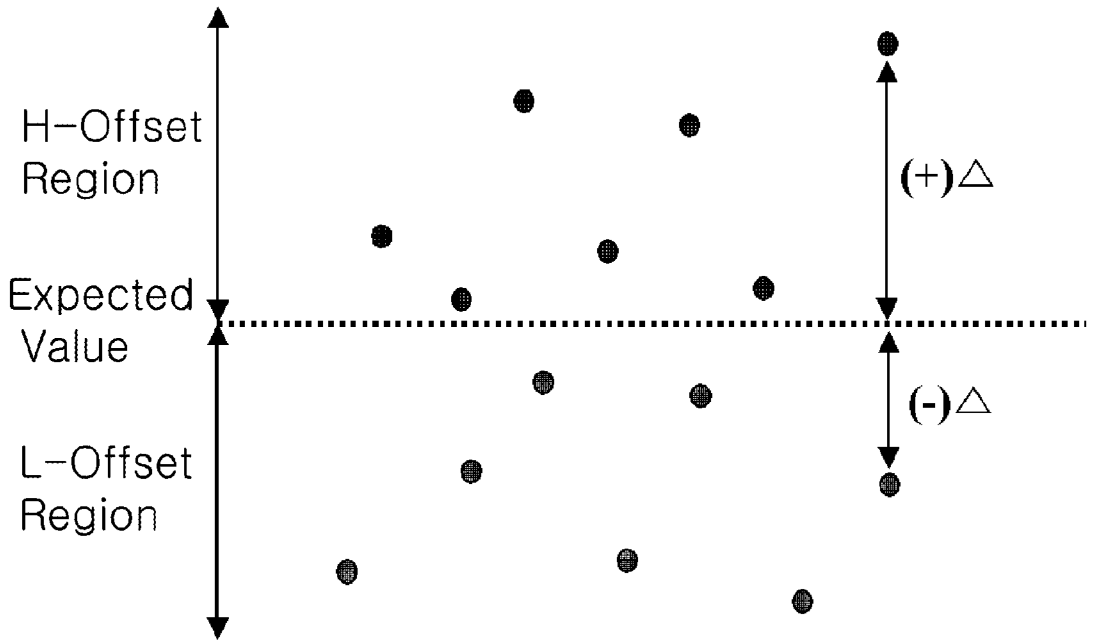
FIG. 3 shows offset spread in the conventional amplifier.
Figure 4:
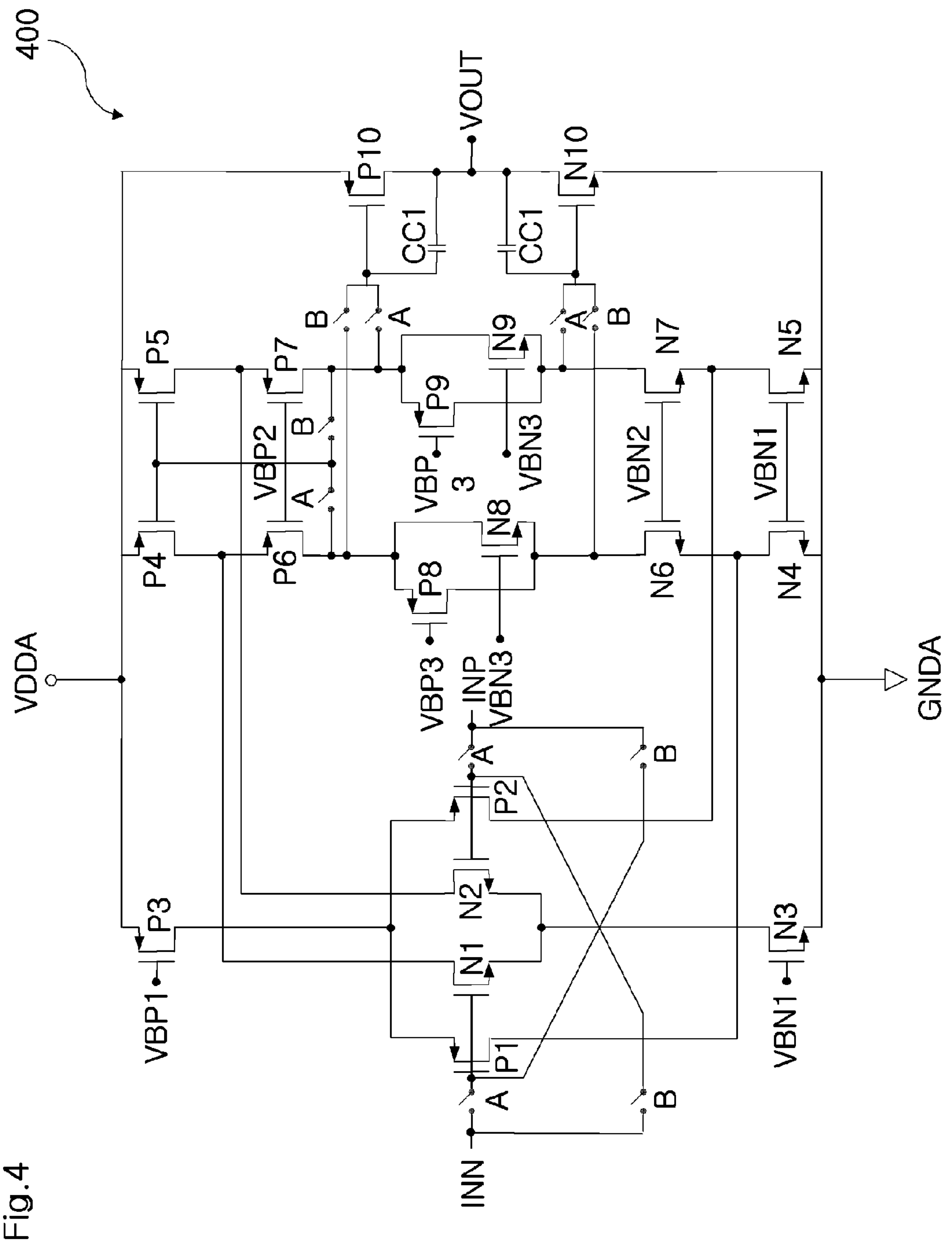
FIG. 4 is a circuit diagram illustrating an amplifier added with dithering switches.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 5:
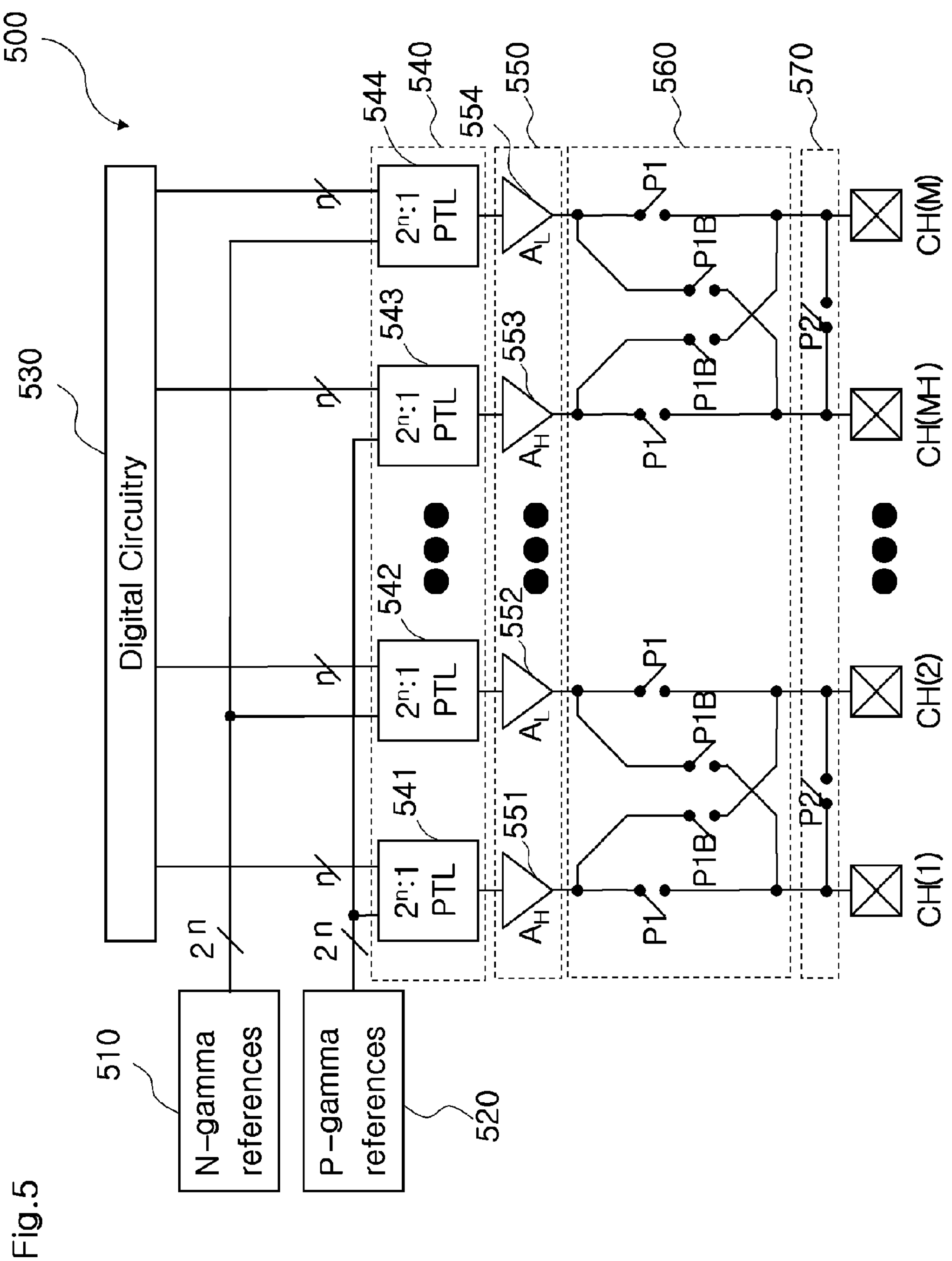
FIG. 5 illustrates a display driving circuit in accordance with an embodiment of the present invention.

FIG. 5 illustrates a display driving circuit in accordance with an embodiment of the present invention.

Referring to FIG. 5, a display driving circuit 500 includes a negative gamma reference voltage generating circuit 510, a positive gamma reference voltage generating circuit 520, a digital circuit 530, a path transistor logic circuit 540, a buffer circuit 550, a path selecting switch circuit 560, and an electric charge sharing switch circuit 570.

The negative gamma reference voltage generating circuit 510 generates gamma reference voltages having voltage levels relatively lower than an optional reference voltage, and the positive gamma reference voltage generating circuit 520 generates gamma reference voltages having voltage levels relatively higher than the optional reference voltage. The path transistor logic circuit 540 selects and outputs gamma reference voltages corresponding to N number of digital data outputted from the digital circuit 530, among $2^N$ (N is an integer) number of gamma reference voltages outputted from each of the positive gamma reference voltage generating circuit 510 and the negative gamma reference voltage generating circuit 520. A plurality of buffers constituting the buffer circuit 550 buffer the gamma reference voltages outputted from the path transistor logic circuit 540 using any one of two kinds of buffers $A_H$ and $A_L$. Amplifiers constituting the two kinds of buffers constituting the buffer circuit 550 will be described later in detail.

The characteristics of the display driving circuit 500 according to the present invention reside in that, after the gamma reference voltages outputted from the path transistor logic circuit 540 are buffered, the gamma reference voltages are transmitted to respective output terminals CH(1) through CH(M) through the path selecting switch circuit 560. Therefore, since the output selecting switch circuit 170 in the conventional display driving circuit 100 shown in FIG. 1 is not used, an entire area can be reduced.

In the display driving circuit 500, the range of voltage levels of the gamma reference voltages outputted from the path transistor logic circuit 540 is preset. Referring to FIG. 5, a first path transistor logic circuit block 541 constituting the path transistor logic circuit 540 selects gamma reference voltages corresponding to N number of digital signals outputted from the digital circuit 530, among gamma reference voltages relatively higher than an optional reference voltage CSM generated by the positive gamma reference voltage generating circuit 520. A second path transistor logic circuit block 542 constituting the path transistor logic circuit 540 selects gamma reference voltages corresponding to the N number of digital signals outputted from the digital circuit 530, among gamma reference voltages relatively lower than an optional reference voltage CSM generated by the negative gamma reference voltage generating circuit 510.

In this case, the range of the gamma reference voltages outputted from the first path transistor logic circuit block 541 and the range of the gamma reference voltages outputted from the second path transistor logic circuit block 542 can be known. Accordingly, the detailed circuits of input terminals and output terminals of the amplifiers for buffering the gamma reference voltages outputted from the path transistor logic circuit 540 can be divided into two types as described below based on the ranges of inputted gamma reference voltages.

Because it is the norm that a buffer is realized in a form in which the output terminal of a differential amplifier is fed back to a negative input terminal as one of two input terminals, the detailed circuit of the buffer will not be described herein.

Figure 6:
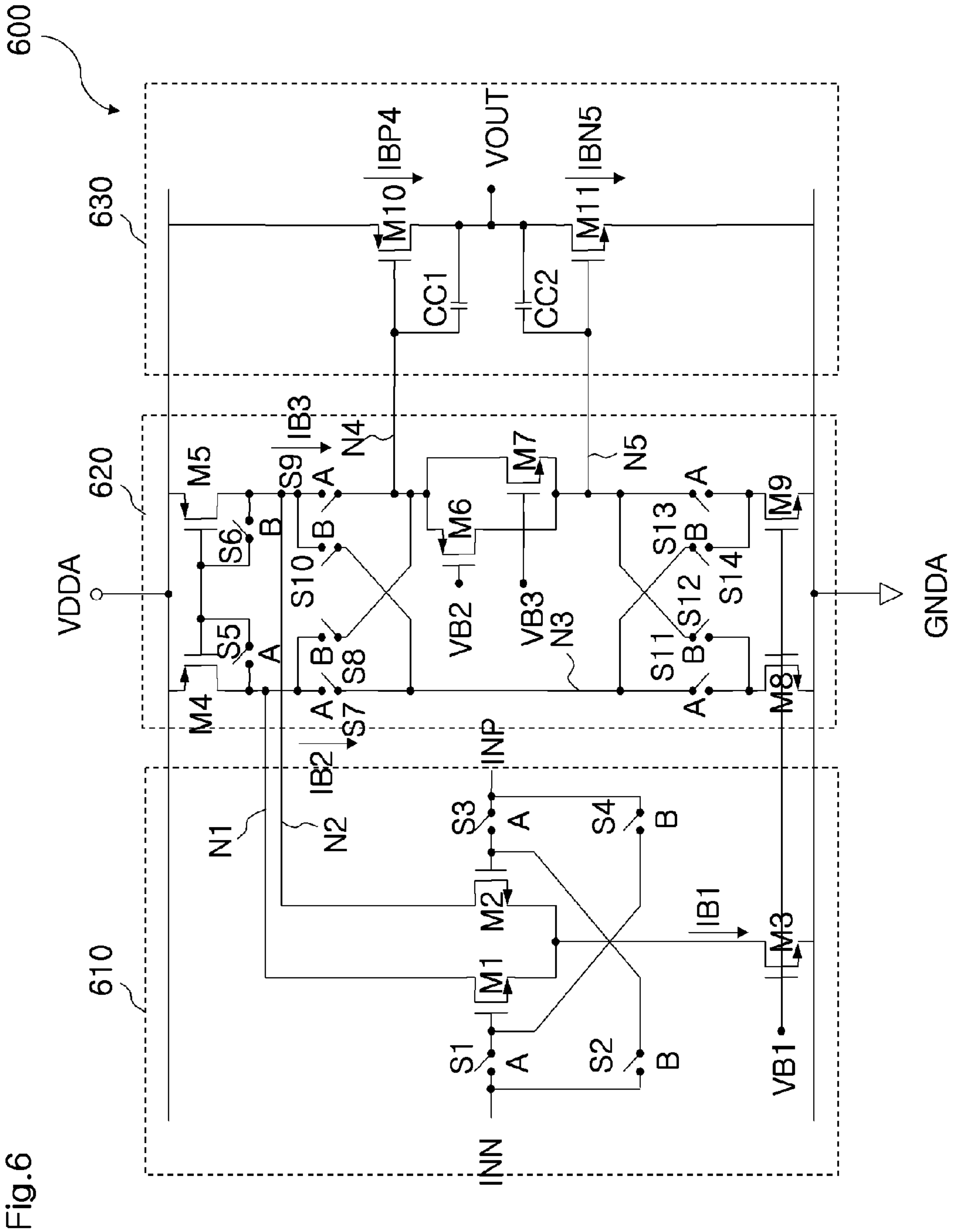
FIG. 6 is a circuit diagram illustrating a first type amplifier according to the present invention.

FIG. 6 is a circuit diagram illustrating a first type amplifier according to the present invention.

Referring to FIG. 6, a first type amplifier 600 is used to buffer the gamma reference voltages corresponding to the N number of digital signals outputted from the digital circuit 530, among the gamma reference voltages relatively higher than the optional reference voltage CSM, and includes an input stage 610, a bias stage 620 and an output stage 630.

The input stage 610 determines the voltage levels of two nodes N1 and N2 in correspondence to two input voltages INN and INP received in response to a first bias voltage VB1, and includes four path selecting switches S1 through S4, two input transistors M1 and M2, and a first bias transistor M3. Here, the path selecting switches are technical terms that are specifically used for the sake of convenience in explanation and are also called dithering switches. The path selecting signals A and B for turning on and off the path selecting switches are enabled exclusively with respect to each other. That is to say, while one signal turns on switches, the other signal turns off switches.

A first path selecting switch S1 switches the first input voltage INN connected to one terminal thereof in response to the first path selecting signal A. A second path selecting switch S2 switches the first input voltage INN connected to one terminal thereof in response to the second path selecting signal B. A third path selecting switch S3 switches the second input voltage INP connected to one terminal thereof in response to the first path selecting signal A. A fourth path selecting switch S4 switches the second input voltage INP connected to one terminal thereof in response to the second path selecting signal B.

A first input transistor M1 has one terminal which is connected to a first node N1, and a gate terminal to which the other terminal of the first path selecting switch S1 and the other terminal of the fourth path selecting switch S4 are commonly connected. A second input transistor M2 has one terminal which is connected to a second node N2, and a gate terminal to which the other terminal of the second path selecting switch S2 and the other terminal of the third path selecting switch S3 are commonly connected. A first bias transistor N3 has one terminal which is commonly connected to the other terminal of the first input transistor M1 and the other terminal of the second input transistor M2, the other terminal which is connected to a second source voltage GNDA, and a gate terminal to which a first bias voltage VB1 is applied.

The bias stage 620 generates two class AB output voltages which correspond to the voltage levels of the two nodes N1 and N2, and includes current mirrors M4 and M5, ten path selecting switches S5 through S14, class AB bias circuits M6 and M7, and two bias transistors M8 and M9.

A fifth path selecting switch S5 switches the voltage or current of the first node N1 which is connected to one terminal thereof, in response to the first path selecting signal A. A sixth path selecting switch S6 switches the voltage or current of the second node N2 which is connected to one terminal thereof, in response to the second path selecting signal B.

A seventh path selecting switch S7 switches the voltage or current of the first node N1 which is connected to one terminal thereof, to a third node N3 in response to the first path selecting signal A. An eighth path selecting switch S8 switches the voltage or current of the first node N1 which is connected to one terminal thereof, to a fourth node N4 in response to the second path selecting signal B. A ninth path selecting switch S9 switches the voltage or current of the second node N2 which is connected to one terminal thereof, to the fourth node N4 in response to the first path selecting signal A. A tenth path selecting switch S10 switches the voltage or current of the second node N2 which is connected to one terminal thereof, to the third node N3 in response to the second path selecting signal B.

An eleventh path selecting switch S11 switches the voltage or current of the third node N3 which is connected to one terminal thereof, in response to the first path selecting signal A. A twelfth path selecting switch S12 switches the voltage or current of a fifth node N5 which is connected to one terminal thereof, in response to the second path selecting signal B. A thirteenth path selecting switch S13 switches the voltage or current of the fifth node N5 which is connected to one terminal thereof, in response to the first path selecting signal A. A fourteenth path selecting switch S14 switches the voltage or current of the third node N3 which is connected to one terminal thereof, in response to the second path selecting signal B.

The current mirrors M4 and M5 comprise a first current mirror transistor M4 having one terminal which is connected to a first source voltage VDDA, the other terminal which is connected to the first node N1, and a gate terminal which is connected to the other terminal of the fifth path selecting switch S5, and a second current mirror transistor M5 having one terminal which is connected to the first source voltage VDDA, the other terminal which is connected to the second node N2, and a gate terminal which is connected to the other terminal of the sixth path selecting switch S6.

The class AB bias circuits M6 and M7 comprise a sixth MOS transistor M6 having one terminal which is connected to the fourth node N4, the other terminal which is connected to the fifth node N5 and a gate terminal to which a second bias voltage VB2 is applied, and a seventh MOS transistor M7 having one terminal which is connected to the fourth node N4, the other terminal which is connected to the fifth node N5 and a gate terminal to which a third bias voltage VB3 is applied.

A second bias transistor M8 as one of the two bias transistors has one terminal which is connected to the second source voltage GNDA, the other terminal which is commonly connected to the other terminal of the eleventh path selecting switch S11 and the other terminal of the twelfth path selecting switch S12, and a gate terminal to which the first bias voltage VB1 is applied. A third bias transistor M9 as the other of the two bias transistors has one terminal which is connected to the second source voltage GNDA, the other terminal which is commonly connected to the other terminal of the thirteenth path selecting switch S13 and the other terminal of the fourteenth path selecting switch S14, and a gate terminal to which the first bias voltage VB1 is applied.

Here, the two class AB output voltages mean the voltages that are outputted from the fourth node N4 and the fifth node N5.

The output stage 630 generates the output voltage VOUT that corresponds to the two class AB output voltages, and includes two coupling capacitors CC1 and CC2 and two push-pull transistors M10 and M11.

A first coupling capacitor CC1 has one terminal which is connected to the fourth node N4 and the other terminal which is connected to an output terminal for outputting the output voltage VOUT. A second coupling capacitor CC2 has one terminal which is connected to the fifth node N5 and the other terminal which is connected to the output terminal.

A tenth MOS transistor M10 has one terminal which is connected to the first source voltage VDDA, the other terminal which is connected to the output terminal, and a gate terminal which is connected to the fourth node N4. An eleventh MOS transistor M11 has one terminal which is connected to the second source voltage GNDA, the other terminal which is connected to the output terminal, and a gate terminal which is connected to the fifth node N5.

In order to ensure that the first type amplifier 600 shown in FIG. 6 is used to buffer the gamma reference voltages corresponding to the N number of digital signals outputted from the digital circuit 530 among the gamma reference voltages relatively higher than the optional reference voltage CSM, the first input transistor M1, the second input transistor M2, the first bias transistor M3, the seventh MOS transistor M7, the second bias transistor M8, the third bias transistor M9 and the eleventh MOS transistor M11 are realized using N-type MOS transistors, and the current mirror transistors M4 and M5, the sixth MOS transistor M6 and the tenth MOS transistor M10 are realized using P-type MOS transistors.

An amount of the current IB1 flowing through the first bias transistor M3 of the input stage 610 is determined by the first bias voltage VB1 applied to the gate terminal of the first bias transistor M3 and becomes the sum of the amounts of current flowing through the two input transistors M1 and M2. In an ideal case, when a difference between the voltages applied to the two input transistors M1 and M2 is 0 (zero), amounts of current flowing through the two input transistors M1 and M2 become the same.

When the amounts of current flowing to the input stage 610 via the first node N1 and the second node N2 are the same, the current mirrors M4 and M5 installed in the bias stage 620 makes an amount of current flowing to the third node N3 and an amount of current flowing to the fifth node N5 via the fourth node N4 the same.

If an amount of current flowing to the second input transistor M2 increases due to the input voltages applied to the two input transistors M1 and M2, an amount of current flowing to the first input transistor M1 decreases. In other words, if an amount of current flowing to the first input transistor M1 via the first current mirror transistor M4 and the first node N1 decreases compared to an amount of current flowing to the second input transistor M2 via the second current mirror transistor M5 and the second node N2, an amount of current IB3 flowing to the fourth node N4 is smaller than an amount of current IB2 flowing to the third node N3. If the amount of current IB3 flowing to the fourth node N4 and the fifth node N5 decreases, the levels of voltages dropping at the two nodes N4 and N5 also decrease. Thus, while an amount of current IBP4 flowing to the tenth MOS transistor M10 increases, an amount of current sinking at the eleventh MOS transistor M11 decreases, as a result of which the output voltage VOUT abruptly increases.

If an amount of current flowing to the second input transistor M2 decreases due to the input voltages applied to the two input transistors M1 and M2, an amount of current flowing to the first input transistor M1 increases. In other words, if an amount of current flowing to the first input transistor M1 via the first current mirror transistor M4 and the first node N1 increases compared to an amount of current flowing to the second input transistor M2 via the second current mirror transistor M5 and the second node N2, an amount of current IB3 flowing to the fourth node N4 is larger than an amount of current IB2 flowing to the third node N3. If the amount of current IB3 flowing to the fourth node N4 and the fifth node N5 increases, the levels of voltages dropping at the two nodes N4 and N5 also increase. Thus, while an amount of current IBP4 flowing to the tenth MOS transistor M10 decreases, an amount of current IBN5 sinking at the eleventh MOS transistor M11 increases, as a result of which the output voltage VOUT abruptly decreases.

Figure 7:
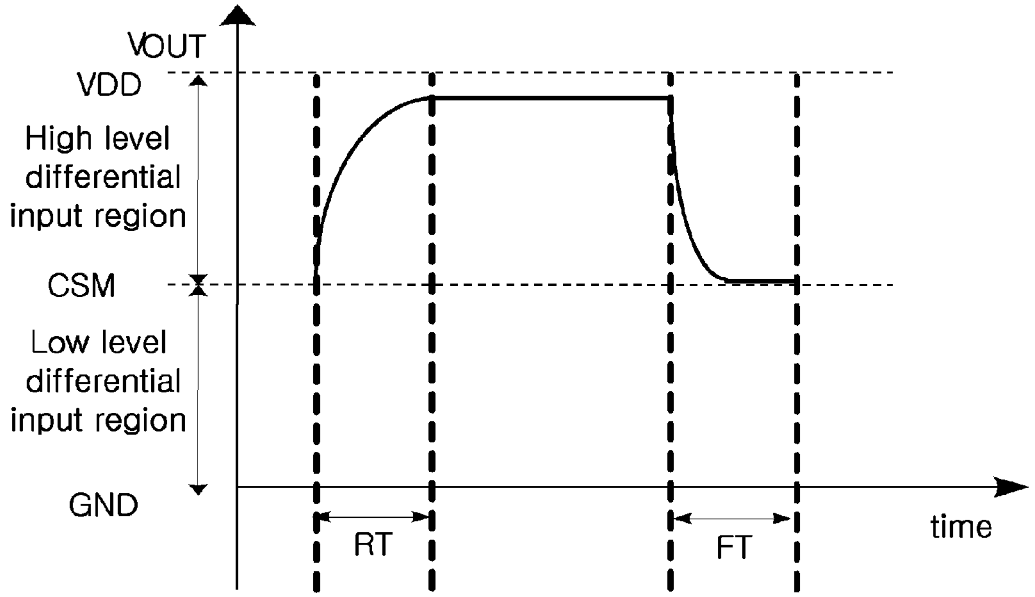
FIG. 7 shows variation of output voltage with respect to time in the first type amplifier shown in FIG. 6.

FIG. 7 shows variation of output voltage with respect to time in the first type amplifier shown in FIG. 6.

Referring to FIG. 7, when buffering the gamma reference voltages corresponding to the N number of digital signals outputted from the digital circuit 530 among the gamma reference voltages relatively higher than the optional reference voltage CSM, the shape of a waveform through an interval $R_T$ in which the waveform rises and an interval $F_T$ in which the waveform falls is the same as the shape of a waveform (not shown) obtained in a general amplifier.

Figure 8:
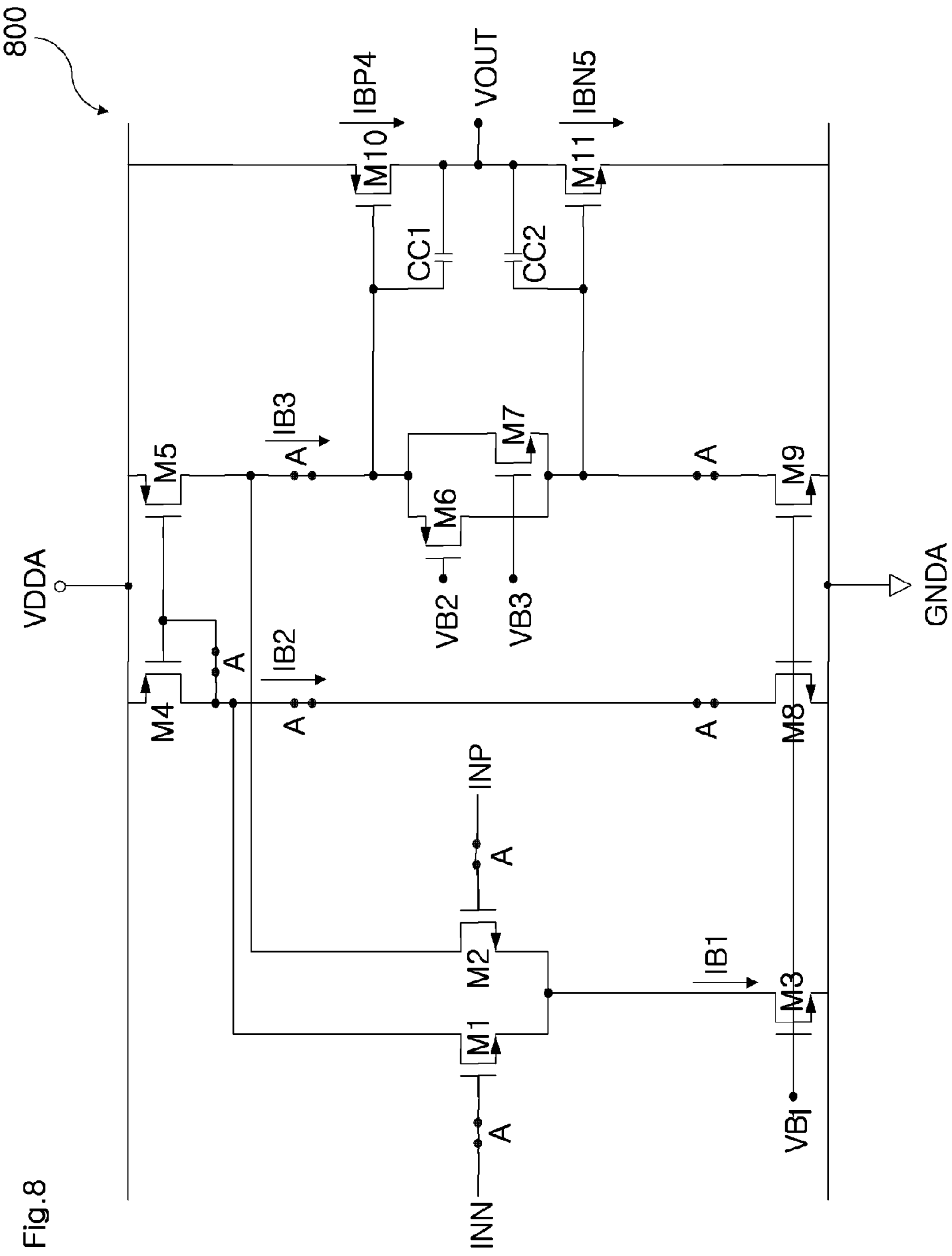
FIG. 8 is a circuit diagram illustrating the first type amplifier shown in FIG. 6 when a first path selection signal is enabled.

FIG. 8 is a circuit diagram illustrating the first type amplifier shown in FIG. 6 when the first path selection signal A is enabled.

Figure 9:
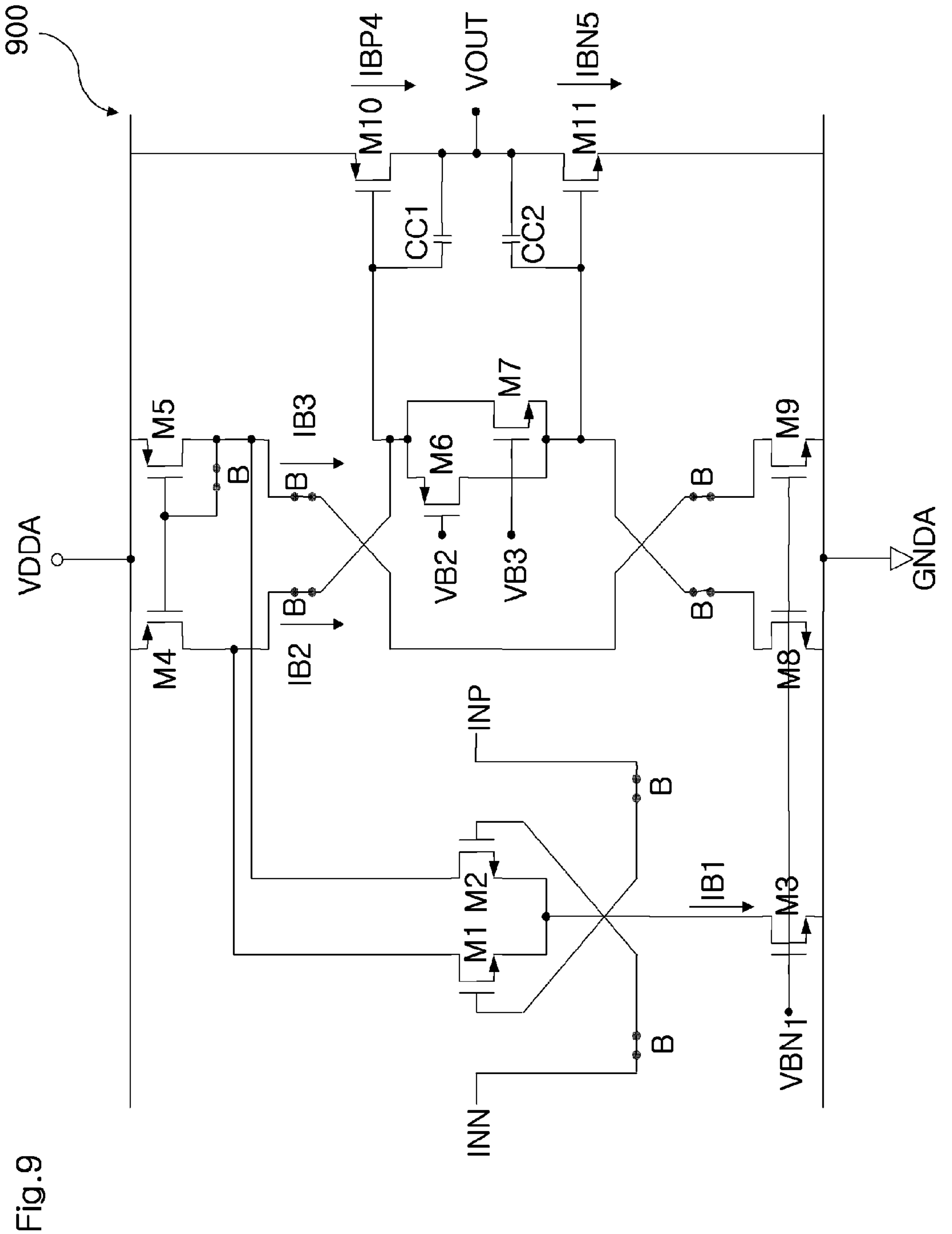
FIG. 9 is a circuit diagram illustrating the first type amplifier shown in FIG. 6 when a second path selection signal is enabled.

FIG. 9 is a circuit diagram illustrating the first type amplifier shown in FIG. 6 when the second path selection signal B is enabled.

Figure 10:
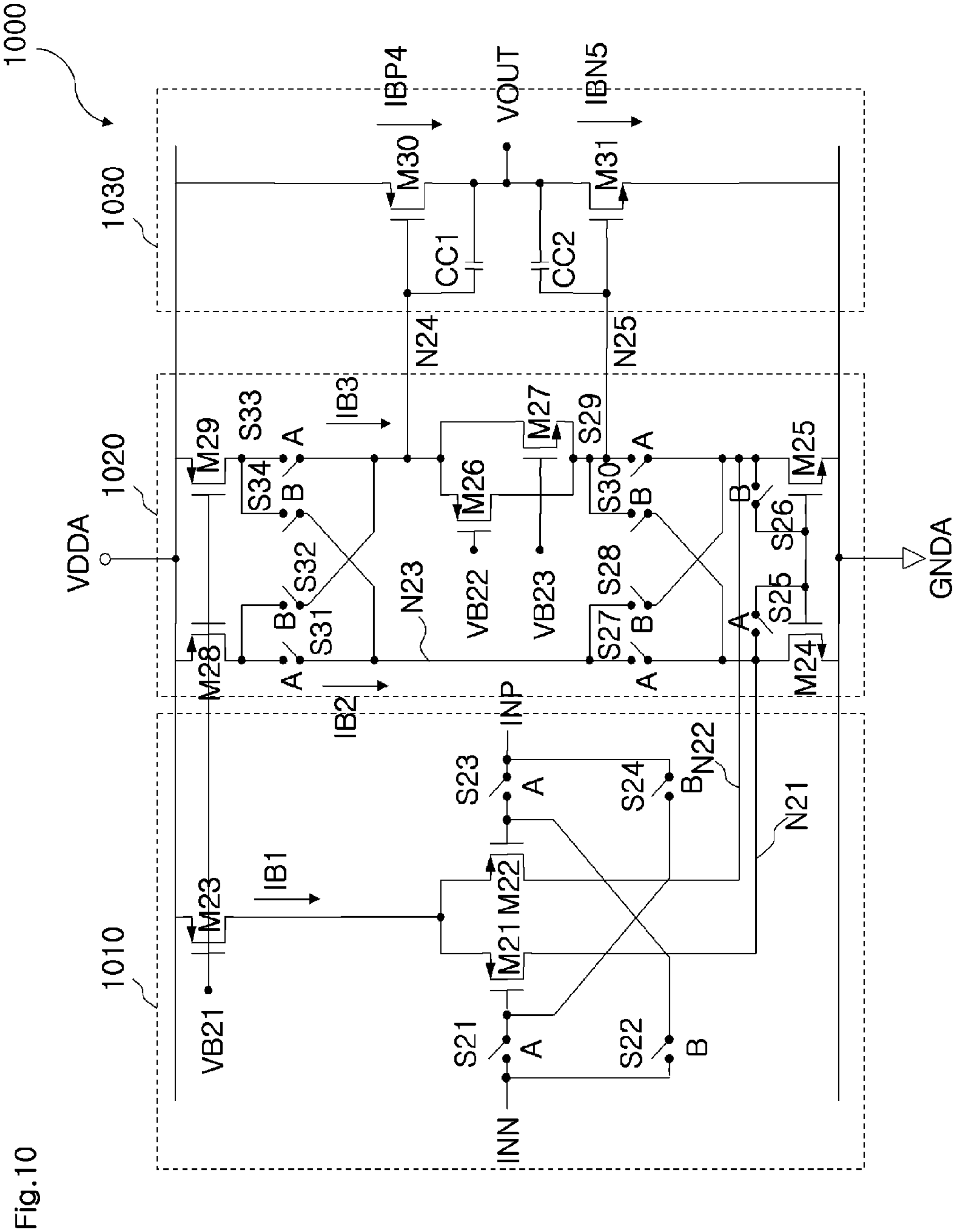
FIG. 10 is a circuit diagram illustrating a second type amplifier according to the present invention.

Referring to FIGS. 8 and 9, as the plurality of path selecting switches, that is, dithering switches are used alternately, paths through which current flows are exchanged with one another. Hence, an offset that can result from deviations in processes can be removed due to the exchange of the current flowing paths. Since the operation of the circuits shown in FIGS. 8 and 9 can be easily understood from the description for the operation of the circuit shown in FIG. 6, it will not be described herein. FIG. 10 is a circuit diagram illustrating a second type amplifier according to the present invention.

Referring to FIG. 10, a second type amplifier 1000 is used to buffer the gamma reference voltages corresponding to the N number of digital signals outputted from the digital circuit 530, among the gamma reference voltages relatively lower than the optional reference voltage CSM, and includes an input stage 1010, a bias stage 1020 and an output stage 1030.

The input stage 1010 determines the voltage levels of two nodes N21 and N22 in correspondence to two input voltages INN and INP received in response to a first bias voltage VB21, and includes four path selecting switches S21 through S24, two input transistors M21 and M22, and a first bias transistor M23.

A first path selecting switch S21 switches the first input voltage INN connected to one terminal thereof in response to the first path selecting signal A. A second path selecting switch S22 switches the first input voltage INN connected to one terminal thereof in response to the second path selecting signal B. A third path selecting switch S23 switches the second input voltage INP connected to one terminal thereof in response to the first path selecting signal A. A fourth path selecting switch S24 switches the second input voltage INP connected to one terminal thereof in response to the second path selecting signal B.

A first input transistor M21 has one terminal which is connected to a first node N21, and a gate terminal to which the other terminal of the first path selecting switch S21 and the other terminal of the fourth path selecting switch S24 are commonly connected. A second input transistor M22 has one terminal which is connected to a second node N22, and a gate terminal to which the other terminal of the second path selecting switch S22 and the other terminal of the third path selecting switch S23 are commonly connected. A first bias transistor N23 has one terminal which is commonly connected to the other terminal of the first input transistor M21 and the other terminal of the second input transistor M22, the other terminal which is connected to the first source voltage VDDA, and a gate terminal to which a first bias voltage VB21 is applied.

The bias stage 1020 generates two class AB output voltages which correspond to the voltage levels of the two nodes N21 and N22, and includes current mirrors M24 and M25, ten path selecting switches S25 through S34, class AB bias circuits M26 and M27, and two bias transistors M28 and M29.

A fifth path selecting switch S25 switches the voltage or current of the first node N21 which is connected to one terminal thereof, in response to the first path selecting signal A. A sixth path selecting switch S26 switches the voltage or current of the second node N22 which is connected to one terminal thereof, in response to the second path selecting signal B.

A seventh path selecting switch S27 switches the voltage or current of the first node N21 which is connected to one terminal thereof, to a third node N23 in response to the first path selecting signal A. An eighth path selecting switch S28 switches the voltage or current of the third node N23 which is connected to one terminal thereof, to the second node N22 in response to the second path selecting signal B. A ninth path selecting switch S29 switches the voltage or current of the second node N22 which is connected to one terminal thereof, to a fifth node N25 in response to the first path selecting signal A. A tenth path selecting switch S30 switches the voltage or current of the first node N21 which is connected to one terminal thereof, to the fifth node N25 in response to the second path selecting signal B.

An eleventh path selecting switch S31 switches the voltage or current of the third node N23 which is connected to one terminal thereof, in response to the first path selecting signal A. A twelfth path selecting switch S32 switches the voltage or current of a fourth node N24 which is connected to one terminal thereof, in response to the second path selecting signal B. A thirteenth path selecting switch S33 switches the voltage or current of the fourth node N24 which is connected to one terminal thereof, in response to the first path selecting signal A. A fourteenth path selecting switch S34 switches the voltage or current of the third node N23 which is connected to one terminal thereof, in response to the second path selecting signal B.

The current mirrors M24 and M25 comprise a first current mirror transistor M24 having one terminal which is connected to the second source voltage GNDA, the other terminal which is connected to the first node N21, and a gate terminal which is connected to the other terminal of the fifth path selecting switch S25, and a second current mirror transistor M25 having one terminal which is connected to the second source voltage GNDA, the other terminal which is connected to the second node N22, and a gate terminal which is connected to the other terminal of the sixth path selecting switch S26.

The class AB bias circuits M26 and M27 comprise a sixth MOS transistor M26 having one terminal which is connected to the fourth node N24, the other terminal which is connected to the fifth node N25 and a gate terminal to which a second bias voltage VB22 is applied, and a seventh MOS transistor M27 having one terminal which is connected to the fourth node N24, the other terminal which is connected to the fifth node N25 and a gate terminal to which a third bias voltage VB23 is applied.

A second bias transistor M28 as one of the two bias transistors has one terminal which is connected to the first source voltage VDDA, the other terminal which is commonly connected to the other terminal of the eleventh path selecting switch S31 and the other terminal of the twelfth path selecting switch S32, and a gate terminal to which the first bias voltage VB21 is applied. A third bias transistor M29 as the other of the two bias transistors has one terminal which is connected to the first source voltage VDDA, the other terminal which is commonly connected to the other terminal of the thirteenth path selecting switch S33 and the other terminal of the fourteenth path selecting switch S34, and a gate terminal to which the first bias voltage VB21 is applied.

Here, the two class AB output voltages mean the voltages that are outputted from the fourth node N24 and the fifth node N25.

The output stage 1030 generates the output voltage VOUT that corresponds to the two class AB output voltages, and includes two coupling capacitors CC1 and CC2 and two push-pull transistors M30 and M31.

A first coupling capacitor CC1 has one terminal which is connected to the fourth node N24 and the other terminal which is connected to an output terminal for outputting the output voltage VOUT. A second coupling capacitor CC2 has one terminal which is connected to the fifth node N25 and the other terminal which is connected to the output terminal.

A tenth MOS transistor M30 has one terminal which is connected to the first source voltage VDDA, the other terminal which is connected to the output terminal, and a gate terminal which is connected to the fourth node N24. An eleventh MOS transistor M31 has one terminal which is connected to the second source voltage GNDA, the other terminal which is connected to the output terminal, and a gate terminal which is connected to the fifth node N25.

In order to ensure that the second type amplifier 1000 shown in FIG. 10 is used to buffer the gamma reference voltages corresponding to the N number of digital signals outputted from the digital circuit 530 among the gamma reference voltages relatively lower than the optional reference voltage CSM, the first input transistor M21, the second input transistor M22, the first bias transistor M23, the sixth MOS transistor M26, the second bias transistor M28, the third bias transistor M29 and the tenth MOS transistor M30 are realized using P-type MOS transistors, and the current mirror transistors M24 and M25, the seventh MOS transistor M27 and the eleventh MOS transistor M31 are realized using N-type MOS transistors.

An amount of the current IB1 flowing through the first bias transistor M23 of the input stage 1010 is determined by the first bias voltage VB21 applied to the gate terminal of the first bias transistor M23 and becomes the sum of the amounts of current flowing through the two input transistors M21 and M22. In an ideal case, when a difference between the voltages applied to the two input transistors M21 and M22 is 0 (zero), amounts of current flowing through the two input transistors M21 and M22 become the same.

When the amounts of current flowing to the input stage 1010 via the first node N21 and the second node N22 are the same, the current mirrors M24 and M25 installed in the bias stage 1020 makes an amount of current flowing to the third node N23 and an amount of current flowing to the fifth node N25 via the fourth node N24 the same.

If an amount of current flowing to the second input transistor M22 decreases due to the input voltages applied to the two input transistors M21 and M22, an amount of current flowing to the first input transistor M21 increases. In other words, if an amount of current flowing to the second source voltage GNDA via the second input transistor M22, the second node N22 and the second current mirror transistor M25 decreases compared to an amount of current flowing to the second source voltage GNDA via the first input transistor M21, the first node N21 and the first current mirror transistor M24, an amount of current IB3 flowing to the fourth node N24 is larger than an amount of current IB2 flowing to the third node N23. If the amount of current IB3 flowing to the fifth node N25 via the fourth node N24 increases, the levels of voltages dropping at the two nodes N24 and N25 also increase. Thus, while an amount of current IBP4 flowing to the tenth MOS transistor M30 decreases, an amount of current IBN5 sinking at the eleventh MOS transistor M31 increases, as a result of which the output voltage VOUT abruptly decreases.

If an amount of current flowing to the second input transistor M22 increases due to the input voltages applied to the two input transistors M21 and M22, an amount of current flowing to the first input transistor M21 decreases. In other words, if an amount of current flowing to the second source voltage GNDA via the second input transistor M22, the second node N22 and the second current mirror transistor M25 increases compared to an amount of current flowing to the second source voltage GNDA via the first input transistor M21, the first node N21 and the first current mirror transistor M24, an amount of current IB3 flowing to the fourth node N24 is smaller than an amount of current IB2 flowing to the third node N23.

If the amount of current IB3 flowing to the fourth node N24 and the fifth node N25 decreases, the levels of voltages dropping at the two nodes N24 and N25 also decrease. Thus, while an amount of current IBP4 flowing to the tenth MOS transistor M30 increases, an amount of current sinking at the eleventh MOS transistor M31 decreases, as a result of which the output voltage VOUT abruptly increases.

Figure 11:
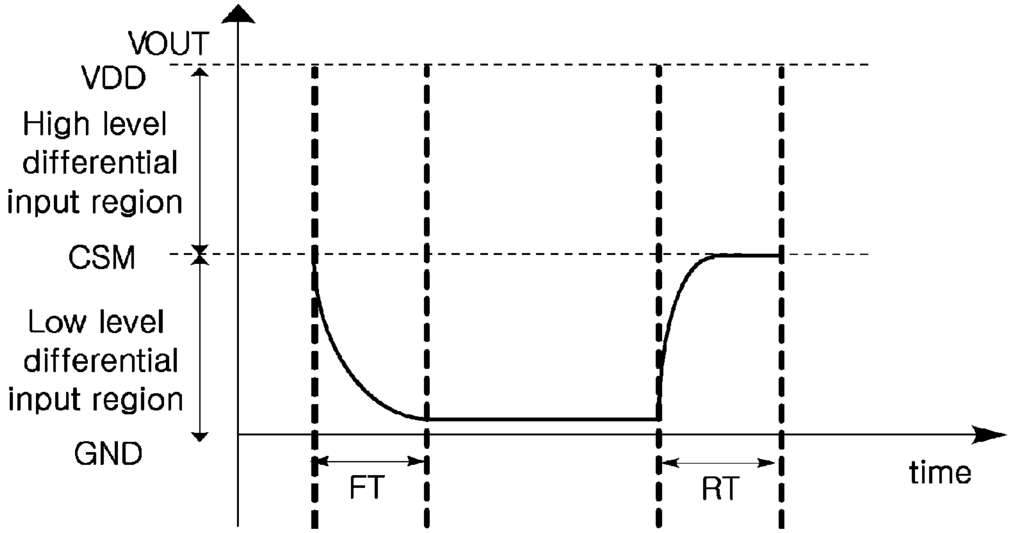
FIG. 11 shows variation of output voltage with respect to time in the second type amplifier shown in FIG. 10.

FIG. 11 shows variation of output voltage with respect to time in the second type amplifier shown in FIG. 10.

Referring to FIG. 11, when buffering the gamma reference voltages corresponding to the N number of digital signals outputted from the digital circuit 530 among the gamma reference voltages relatively lower than the optional reference voltage CSM, the shape of a waveform through an interval $R_T$ in which the waveform rises and an interval $F_T$ in which the waveform falls is the same as the shape of a waveform (not shown) obtained in a general amplifier.

Figure 12:
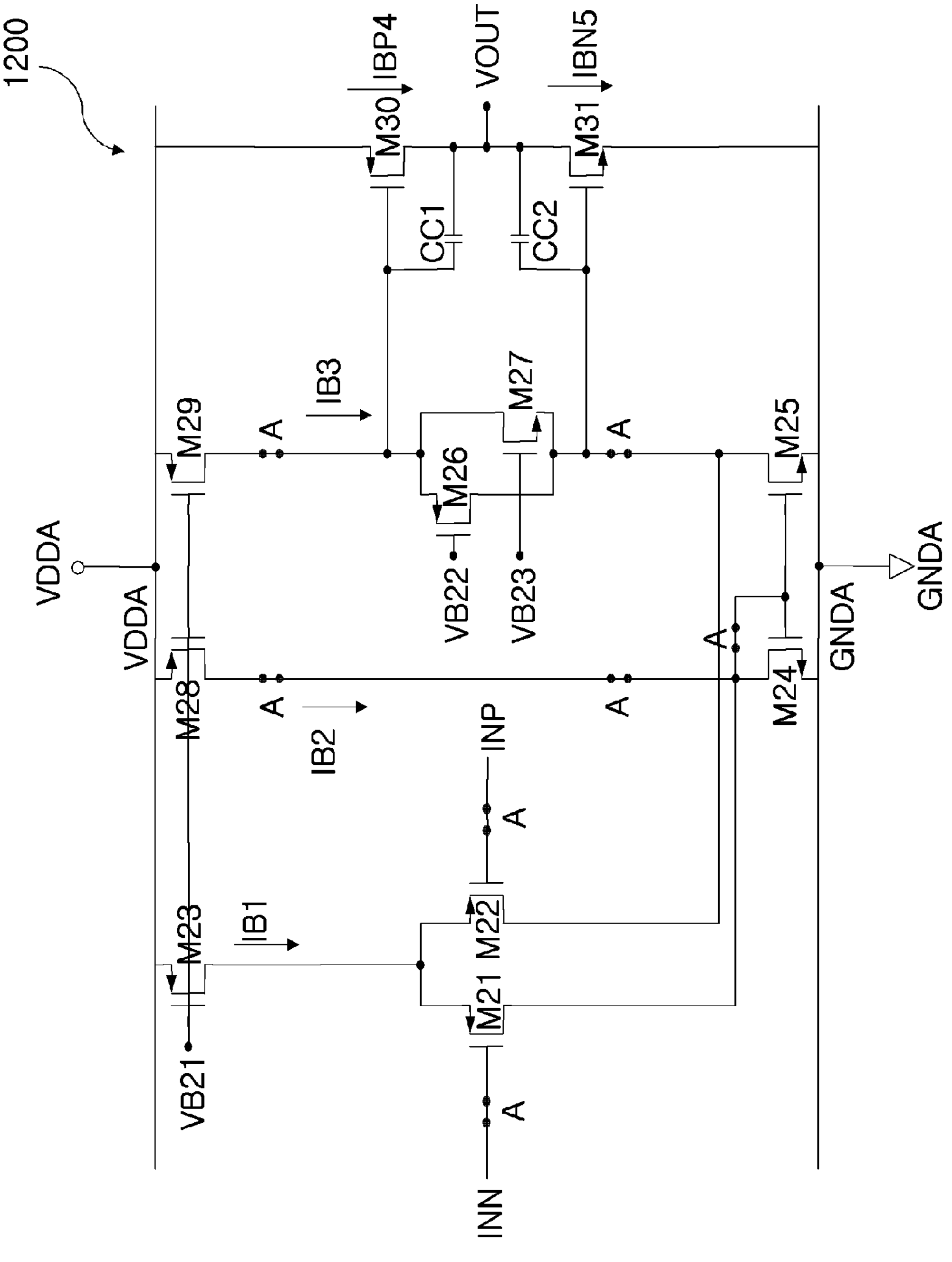
FIG. 12 is a circuit diagram illustrating the second type amplifier shown in FIG. 10 when the first path selection signal is enabled.

FIG. 12 is a circuit diagram illustrating the second type amplifier shown in FIG. 10 when the first path selection signal A is enabled.

Figure 13:
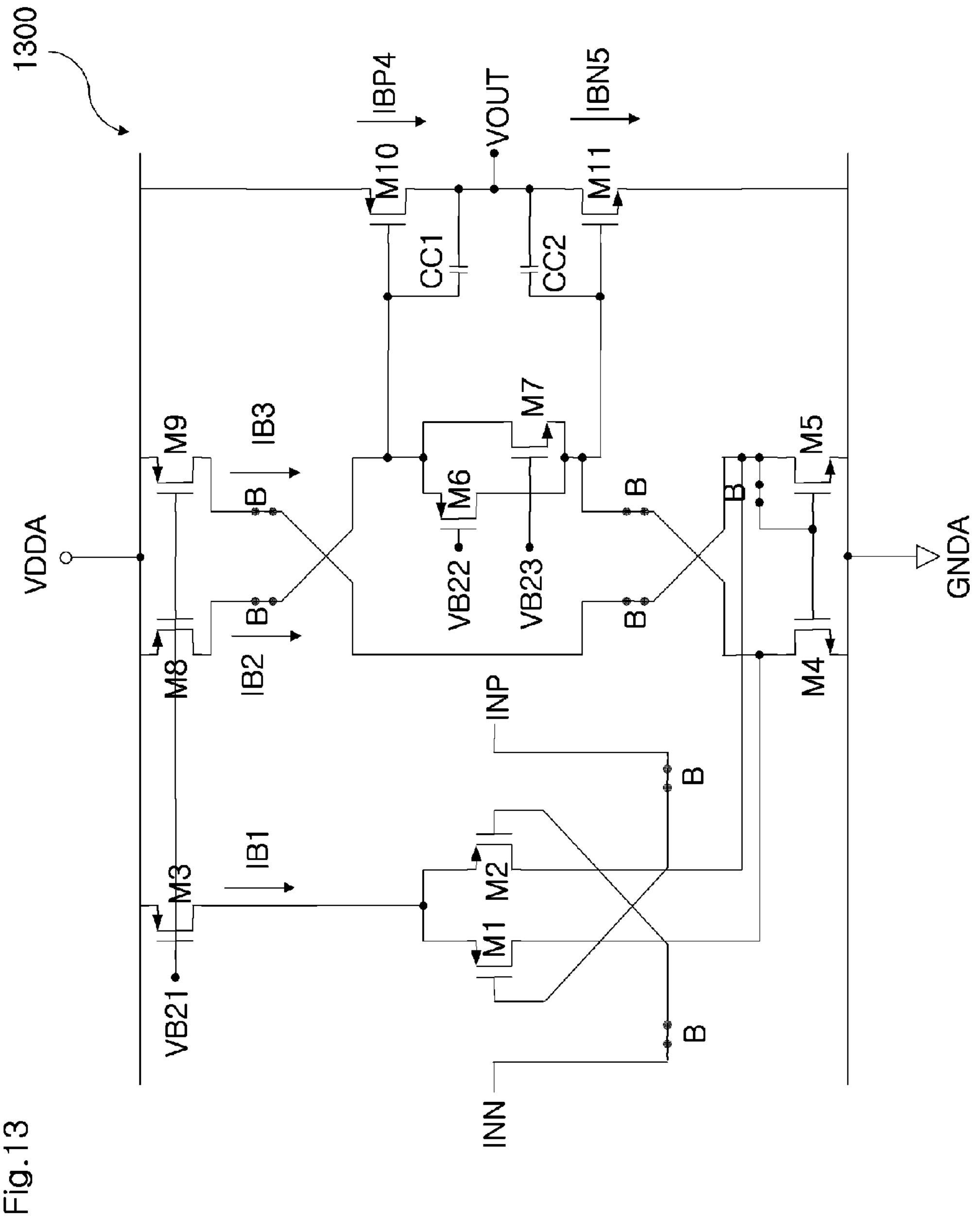
FIG. 13 is a circuit diagram illustrating the second type amplifier shown in FIG. 10 when the second path selection signal is enabled.

FIG. 13 is a circuit diagram illustrating the second type amplifier shown in FIG. 10 when the second path selection signal B is enabled.

Referring to FIGS. 11 and 12, as the plurality of path selecting switches, that is, dithering switches are used alternately, paths through which current flows are exchanged with one another. Hence, an offset that can result from deviations in processes can be removed due to the exchange of the current flowing paths. Since the operation of the circuits shown in FIGS. 11 and 12 can be easily understood from the description for the operation of the circuit shown in FIG. 10, it will not be described herein.

As is apparent from the above description, the present invention provides advantages in that, since the numbers of MOS transistors and switches constituting an amplifier are minimized, not only the layout area occupied by the amplifier is decreased due to the decrease in the number of component elements of the amplifier, but also the layout area of a display driving circuit using the amplifier as a buffer and thus having a decreased number of switches is decreased.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. An amplifier having dithering switches, comprising:

an input stage configured to determine voltage levels of two nodes in correspondence to two input voltages received in response to a first bias voltage, and including four path selecting switches, two input transistors and one bias transistor;

a bias stage configured to generate two class AB output voltages which correspond to the voltage levels of the two nodes, and including current mirrors, ten path selecting switches, class AB bias circuits and two bias transistors; and an output stage configured to generate an output voltage VOUT that corresponds to the two class AB output voltages, and including two coupling capacitors and two push-pull transistors, wherein the plurality of path selecting switches operate by one signal of a first path selecting signal and a second path selecting signal that are exclusively enabled with respect to each other.

2. The amplifier according to claim 1, wherein the input stage comprises:

a first path selecting switch configured to switch the first input voltage connected to one terminal thereof in response to the first path selecting signal;

a second path selecting switch configured to switch the first input voltage connected to one terminal thereof in response to the second path selecting signal;

a third path selecting switch configured to switch the second input voltage connected to one terminal thereof in response to the first path selecting signal;

a fourth path selecting switch configured to switch the second input voltage connected to one terminal thereof in response to the second path selecting signal;

a first input transistor having one terminal which is connected to the first node, and a gate terminal to which the other terminal of the first path selecting switch and the other terminal of the fourth path selecting switch are commonly connected;

a second input transistor having one terminal which is connected to the second node, and a gate terminal to which the other terminal of the second path selecting switch and the other terminal of the third path selecting switch are commonly connected; and a first bias transistor has one terminal which is commonly connected to the other terminal of the first input transistor and the other terminal of the second input transistor, the other terminal which is connected to a second source voltage, and a gate terminal to which the first bias voltage is applied.

3. The amplifier according to claim 1, wherein the ten path selecting switches of the bias stage comprise:

a fifth path selecting switch configured to switch a voltage or current of the first node which is connected to one terminal thereof, in response to the first path selecting signal;

a sixth path selecting switch configured to switch a voltage or current of the second node which is connected to one terminal thereof, in response to the second path selecting signal;

a seventh path selecting switch configured to switch the voltage or current of the first node which is connected to one terminal thereof, to a third node in response to the first path selecting signal;

an eighth path selecting switch configured to switch the voltage or current of the first node which is connected to one terminal thereof, to a fourth node in response to the second path selecting signal;

a ninth path selecting switch configured to switch the voltage or current of the second node which is connected to one terminal thereof, to the fourth node in response to the first path selecting signal; and a tenth path selecting switch configured to switch the voltage or current of the second node which is connected to one terminal thereof, to the third node in response to the second path selecting signal, an eleventh path selecting switch configured to switch a voltage or current of the third node which is connected to one terminal thereof, in response to the first path selecting signal;

a twelfth path selecting switch configured to switch a voltage or current of a fifth node which is connected to one terminal thereof, in response to the second path selecting signal;

a thirteenth path selecting switch configured to switch the voltage or current of the fifth node which is connected to one terminal thereof, in response to the first path selecting signal; and a fourteenth path selecting switch configured to switch the voltage or current of the third node which is connected to one terminal thereof, in response to the second path selecting signal, wherein the current mirrors of the bias stage comprise:

a first current mirror transistor having one terminal which is connected to a first source voltage, the other terminal which is connected to the first node, and a gate terminal which is connected to the other terminal of the fifth path selecting switch; and a second current mirror transistor having one terminal which is connected to the first source voltage, the other terminal which is connected to the second node, and a gate terminal which is connected to the other terminal of the sixth path selecting switch, wherein the class AB bias circuits of the bias stage comprise:

a sixth MOS transistor having one terminal which is connected to the fourth node, the other terminal which is connected to the fifth node, and a gate terminal to which a second bias voltage is applied; and a seventh MOS transistor having one terminal which is connected to the fourth node, the other terminal which is connected to the fifth node, and a gate terminal to which a third bias voltage is applied, and wherein the two bias transistors of the bias stage comprise:

a second bias transistor having one terminal which is connected to the second source voltage, the other terminal which is commonly connected to the other terminal of the eleventh path selecting switch and the other terminal of the twelfth path selecting switch, and a gate terminal to which the first bias voltage is applied; and a third bias transistor having one terminal which is connected to the second source voltage, the other terminal which is commonly connected to the other terminal of the thirteenth path selecting switch and the other terminal of the fourteenth path selecting switch, and a gate terminal to which the first bias voltage is applied.

4. The amplifier according to claim 1, wherein the two coupling capacitors of the output stage comprise:

a first coupling capacitor having one terminal which is connected to the fourth node and the other terminal which is connected to an output terminal for outputting the output voltage; and a second coupling capacitor having one terminal which is connected to the fifth node and the other terminal which is connected to the output terminal, and wherein the two push-pull transistors of the output stage comprise:

a tenth MOS transistor having one terminal which is connected to the first source voltage, the other terminal which is connected to the output terminal, and a gate terminal which is connected to the fourth node; and an eleventh MOS transistor having one terminal which is connected to the second source voltage, the other terminal which is connected to the output terminal, and a gate terminal which is connected to the fifth node.

5. The amplifier according to claim 1, wherein the input stage comprises:

a first path selecting switch configured to switch the first input voltage connected to one terminal thereof in response to the first path selecting signal;

a second path selecting switch configured to switch the first input voltage connected to one terminal thereof in response to the second path selecting signal;

a third path selecting switch configured to switch the second input voltage connected to one terminal thereof in response to the first path selecting signal;

a fourth path selecting switch configured to switch the second input voltage connected to one terminal thereof in response to the second path selecting signal;

a first input transistor having one terminal which is connected to the first node, and a gate terminal to which the other terminal of the first path selecting switch and the other terminal of the fourth path selecting switch are commonly connected;

a second input transistor having one terminal which is connected to the second node, and a gate terminal to which the other terminal of the second path selecting switch and the other terminal of the third path selecting switch are commonly connected; and a first bias transistor having one terminal which is commonly connected to the other terminal of the first input transistor and the other terminal of the second input transistor, the other terminal which is connected to a first source voltage, and a gate terminal to which the first bias voltage is applied.

6. The amplifier according to claim 1, wherein the ten path selecting switches of the bias stage comprise:

a fifth path selecting switch configured to switch the voltage or current of the first node which is connected to one terminal thereof, in response to the first path selecting signal;

a sixth path selecting switch configured to switch the voltage or current of the second node which is connected to one terminal thereof, in response to the second path selecting signal;

a seventh path selecting switch configured to switch the voltage or current of the first node which is connected to one terminal thereof, to a third node in response to the first path selecting signal;

an eighth path selecting switch configured to switch the voltage or current of the third node which is connected to one terminal thereof, to the second node in response to the second path selecting signal;

a ninth path selecting switch configured to switch the voltage or current of the second node which is connected to one terminal thereof, to a fifth node in response to the first path selecting signal;

a tenth path selecting switch configured to switch the voltage or current of the first node which is connected to one terminal thereof, to the fifth node in response to the second path selecting signal;

an eleventh path selecting switch configured to switch a voltage or current of the third node which is connected to one terminal thereof, in response to the first path selecting signal;

a twelfth path selecting switch configured to switch a voltage or current of a fourth node which is connected to one terminal thereof, in response to the second path selecting signal;

a thirteenth path selecting switch configured to switch the voltage or current of the fourth node which is connected to one terminal thereof, in response to the first path selecting signal; and a fourteenth path selecting switch configured to switch the voltage or current of the third node which is connected to one terminal thereof, in response to the second path selecting signal, wherein the current mirrors of the bias stage comprise:

a first current mirror transistor having one terminal which is connected to a second source voltage, the other terminal which is connected to the first node, and a gate terminal which is connected to the other terminal of the fifth path selecting switch; and a second current mirror transistor having one terminal which is connected to the second source voltage, the other terminal which is connected to the second node, and a gate terminal which is connected to the other terminal of the sixth path selecting switch, wherein the class AB bias circuits of the bias stage comprise:

a sixth MOS transistor having one terminal which is connected to the fourth node, the other terminal which is connected to the fifth node and a gate terminal to which a second bias voltage is applied; and a seventh MOS transistor having one terminal which is connected to the fourth node, the other terminal which is connected to the fifth node and a gate terminal to which a third bias voltage is applied, and wherein the two bias transistors of the bias stage comprise:

a second bias transistor having one terminal which is connected to the first source voltage, the other terminal which is commonly connected to the other terminal of the eleventh path selecting switch and the other terminal of the twelfth path selecting switch, and a gate terminal to which the first bias voltage is applied; and a third bias transistor having one terminal which is connected to the first source voltage, the other terminal which is commonly connected to the other terminal of the thirteenth path selecting switch and the other terminal of the fourteenth path selecting switch, and a gate terminal to which the first bias voltage is applied.

7. The amplifier according to claim 1, wherein the two coupling capacitors of the output stage comprise:

a first coupling capacitor having one terminal which is connected to the fourth node and the other terminal which is connected to an output terminal for outputting the output voltage VOUT; and a second coupling capacitor having one terminal which is connected to the fifth node and the other terminal which is connected to the output terminal, and wherein the two push-pull transistors of the output stage comprise:

a tenth MOS transistor having one terminal which is connected to the first source voltage, the other terminal which is connected to the output terminal, and a gate terminal which is connected to the fourth node; and an eleventh MOS transistor having one terminal which is connected to the second source voltage, the other terminal which is connected to the output terminal, and a gate terminal which is connected to the fifth node.

* * * * *